US012646433B2

(12) United States Patent
Xie et al.

(10) Patent No.: US 12,646,433 B2
(45) Date of Patent: *Jun. 2, 2026

(54) SHIFT-REGISTER UNIT, GRID DRIVING CIRCUIT AND DISPLAYING DEVICE

(71) Applicants: Hefei Xinsheng Optoelectronics Technology Co., Ltd., Hefei (CN); BOE Technology Group Co., Ltd., Beijing (CN)

(72) Inventors: Yongxian Xie, Beijing (CN); Zhixiang Zou, Beijing (CN); Feng Qu, Beijing (CN); Chuanjiang Tang, Beijing (CN); Tong Yang, Beijing (CN); Xiaoye Ma, Beijing (CN); Fengzhen Lv, Beijing (CN); Ran Zhang, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/930,401

(22) Filed: Oct. 29, 2024

(65) Prior Publication Data

US 2025/0054430 A1 Feb. 13, 2025

Related U.S. Application Data

(63) Continuation of application No. 18/274,872, filed as application No. PCT/CN2022/120251 on Sep. 21, 2022, now Pat. No. 12,165,554.

(30) Foreign Application Priority Data

Dec. 31, 2021 (CN) .......................... 202111674384.1

(51) Int. Cl.
  *G11C 19/28* (2006.01)
  *G09G 3/20* (2006.01)
(52) U.S. Cl.
  CPC ............... *G09G 3/20* (2013.01); *G11C 19/28* (2013.01); *G09G 2300/0842* (2013.01); *G09G 2310/0286* (2013.01)
(58) Field of Classification Search
  CPC ............ G09G 3/20; G09G 2300/0842; G09G 2310/0286; G09G 2310/08; G11C 19/28
  See application file for complete search history.

(56) References Cited

U.S. PATENT DOCUMENTS 10,418,385 B2 9/2019 Wu et al.
12,165,554 B2 * 12/2024 Xie ........................ G11C 19/28
(Continued)

FOREIGN PATENT DOCUMENTS

CN 1531102 A 9/2004
CN 101354867 A 1/2009
(Continued)

OTHER PUBLICATIONS

European Search Report dated Oct. 4, 2024, issued in counterpart application No. 22913549.6. (5 pages).
(Continued)

*Primary Examiner* — Stephen G Sherman
(74) *Attorney, Agent, or Firm* — WHDA, LLP

(57) ABSTRACT

A shift-register unit, a grid driving circuit and a displaying device, which relates to the technical field of displaying. In the present disclosure, the oxide-semiconductor layers of the oxide thin-film transistors may be delimited into regions according to the total channel widths and the channel lengths required by the oxide thin-film transistors in the shift-register unit, wherein the sum of the widths of the independent semiconductor branches obtained by the delimitation is (Continued)

source 10, drain 20 and lead wires grid 40 and lead wires oxide-semiconductor layer 30 electrode terminal 60 equal to the required total channel width. Accordingly, one oxide thin-film transistor can realize the required total channel width by using the one or more semiconductor branches, to ensure the normal operation of the oxide thin-film transistor, whereby the oxide-semiconductor layers of the different oxide thin-film transistors can be configured differently, to realize the purpose of reducing the border frame of the displaying device.

19 Claims, 7 Drawing Sheets

(56) References Cited

U.S. PATENT DOCUMENTS

| | | |
|---|---|---|
| 2004/0227210 A1 | 11/2004 | Tilke et al. |
| 2005/0156858 A1 | 7/2005 | Ahn et al. |
| 2011/0274234 A1 | 11/2011 | Sakamoto et al. |
| 2013/0099238 A1 | 4/2013 | Chen et al. |
| 2015/0069348 A1 | 3/2015 | Tae |
| 2018/0358469 A1 | 12/2018 | Uchida et al. |
| 2019/0155433 A1 | 5/2019 | Park et al. |
| 2020/0043931 A1 | 2/2020 | Sato et al. |
| 2020/0350388 A1 | 11/2020 | Song et al. |

| | | |
|---|---|---|
| 2022/0208792 A1 | 6/2022 | Lai et al. |
| 2022/0320211 A1 | 10/2022 | Zhao et al. |
| 2022/0344480 A1 | 10/2022 | Wang et al. |

FOREIGN PATENT DOCUMENTS

| | | |
|---|---|---|
| CN | 102566112 A | 7/2012 |
| CN | 108292685 A | 7/2018 |
| CN | 108777127 A | 11/2018 |
| CN | 110007792 A | 7/2019 |
| CN | 110767680 A | 2/2020 |
| CN | 111179803 A | 5/2020 |
| CN | 111863837 A | 10/2020 |
| CN | 112820738 A | 5/2021 |
| CN | 113851485 A | 12/2021 |
| EP | 2162920 A1 | 3/2010 |

OTHER PUBLICATIONS

English Translation of abstract for CN113851485A (1 page).
Non-Final Office Action dated Apr. 15, 2024, issued in U.S. Appl. No. 18/274,872 (19 pages).
Notice of Allowance dated Jul. 30, 2024, issued in U.S. Appl. No. 18/274,872 (6 pages).
Office Action dated Jun. 30, 2025, issued in counterpart CN Application No. 202111674384.1, with English translation. (18 pages).

* cited by examiner

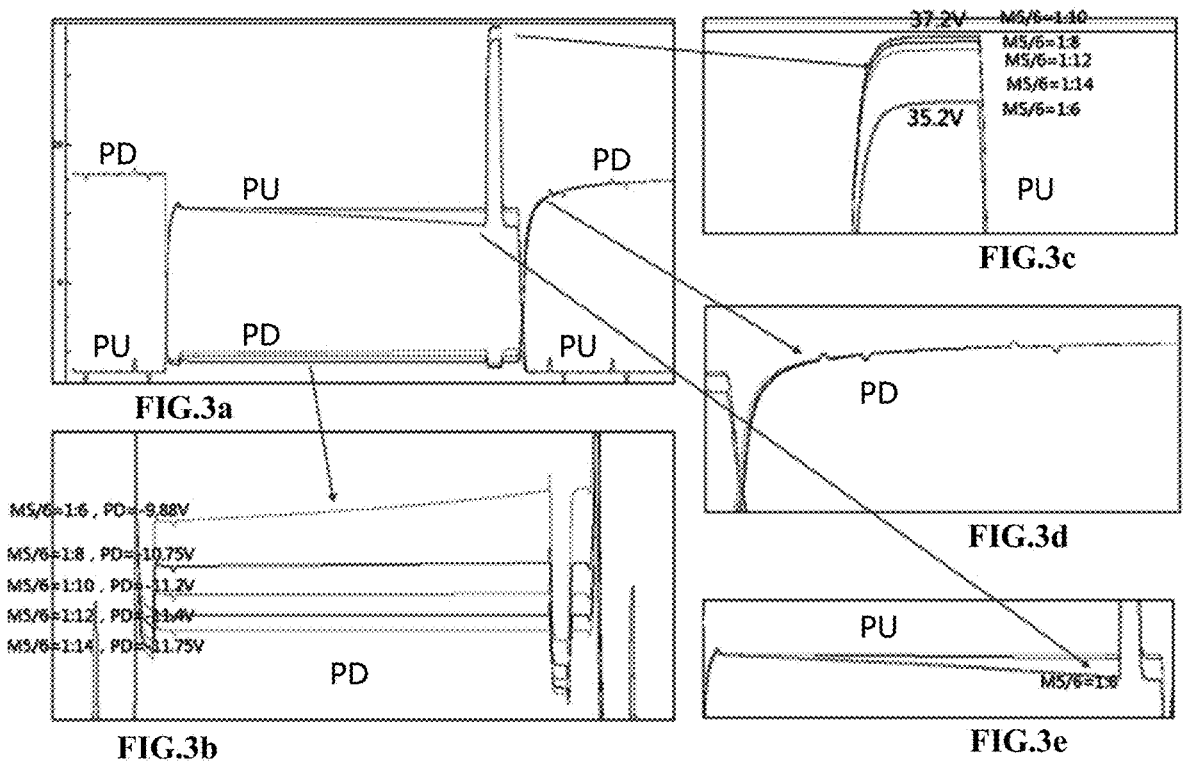
FIG.3a
FIG.3b
FIG.3c
FIG.3d
FIG.3e
FIG. 3
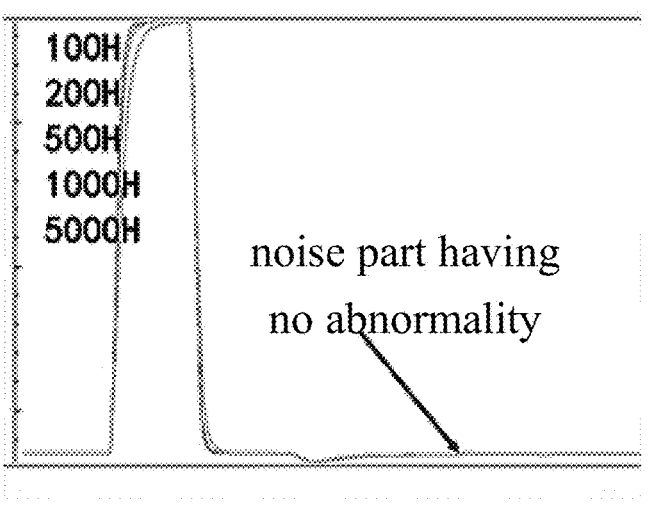
noise part having
no abnormality
FIG. 4

SHIFT-REGISTER UNIT, GRID DRIVING CIRCUIT AND DISPLAYING DEVICE

CROSS REFERENCE TO RELATED APPLICATIONS

The present application is a continuation application of U.S. application Ser. No. 18/274,872, which claims priority to Chinese Patent application No. 202111674384.1 filed with the China National Intellectual Property Administration on Dec. 31, 2021, the contents of both of them are incorporated herein by reference.

TECHNICAL FIELD

The present disclosure relates to the technical field of displaying, and particularly relates to a shift-register unit, a grid driving circuit and a displaying device.

BACKGROUND

Oxide Thin-Film Transistors (Oxide TFT) have the characteristics of a high electron mobility and a low leakage current, and may be applied in display products with a high resolution, a high refresh rate, a low power consumption, low-frequency driving, a large size and so on, to satisfy the continuously increasing demands on displaying.

The semiconductor region in an oxide thin-film transistor is the oxide-semiconductor layer. The heat generation by the semiconductor region easily results in an excessively quick drifting of the threshold voltage of the oxide thin-film transistor, which causes failure of the oxide thin-film transistor.

SUMMARY

The present disclosure discloses a shift-register unit, located on a substrate of a display panel, located in a non-displaying region, comprising a plurality of oxide thin-film transistors, each of the plurality of oxide thin-film transistors comprising an oxide-semiconductor layer and a source and a drain that are connected to the oxide-semiconductor layer and are separately provided, wherein each of the source and the drain of at least some of the oxide thin-film transistors has a plurality of branches;

the source comprises a plurality of source branches extending in a first direction, and the drain comprises a plurality of drain branches extending in the first direction;

the plurality of source branches and the plurality of drain branches face each other and sequentially intersect in a second direction;

the oxide-semiconductor layer has at least one semiconductor branch or a plurality of semiconductor branches that are separately and parallelly distributed, each of the semiconductor branches extends in the second direction perpendicular to an extension direction of the drain and overlaps with and is electrically connected to the source branches and the drain branches, and a width of the semiconductor branch that overlaps with any neighboring source branch and drain branch is a distance W of the semiconductor branch from one end to the other end in the first direction; and the at least some of the oxide thin-film transistors are the plurality of oxide thin-film transistors, and the widths of the semiconductor branches of different oxide thin-film transistors are not completely equal.

Optionally, the width W of each of the semiconductor branches of the at least some of the oxide thin-film transistors is not less than 3 μm, and not greater than 60 ρm.

Optionally, the shift-register unit comprises a pull-down controlling circuit, and the pull-down controlling circuit comprises: a first oxide thin-film transistor located between a pull-down node and a high-level reference-voltage terminal, and a second oxide thin-film transistor located between the pull-down node and a low-level reference-voltage terminal;

each of the oxide thin-film transistors satisfies the following formula: $W_{total} = D_{total\ channel\ quantity} * W$;

where W is a width of each of the semiconductor branches, $D_{total\ channel\ quantity}$ is a sum of quantities of channels of the semiconductor branches between the source branches and the neighboring drain branches in each of the oxide thin-film transistors, and $W_{total}$ is a total width of the channels; and a ratio of $W_{total}$ of the first oxide thin-film transistor to $W_{total}$ of the second oxide thin-film transistor is between 0.05-0.17.

Optionally, the $W_{total}$ of the first oxide thin-film transistor is not less than 3 μm, and the $W_{total}$ of the second oxide thin-film transistor is not greater than 60 μm.

Optionally, the pull-down controlling circuit has one or two instances of the pull-down node, a quantity of the first oxide thin-film transistor is one or two oxide thin-film transistors that are correspondingly connected to the pull-down nodes one to one, and a quantity of the second oxide thin-film transistor is one or two oxide thin-film transistors that are correspondingly connected to the pull-down nodes one to one;

in the two first oxide thin-film transistors, channel lengths are equal, the widths of the semiconductor branches are equal, the quantities of the semiconductor branches are equal, and spacings between the neighboring semiconductor branches are equal; and in the two second oxide thin-film transistors, channel lengths are equal, the widths of the semiconductor branches are equal, the quantities of the semiconductor branches are equal, and spacings between the neighboring semiconductor branches are equal.

Optionally, a quantity of the semiconductor branches of each of the first oxide thin-film transistors is one, quantities of the source branches and the drain branches are one individually, the width of each of the semiconductor branches is 3-6 μm, and the width of the semiconductor branches is a total width of the channels of the first oxide thin-film transistor.

Optionally, the $W_{total}$ of the second oxide thin-film transistor is between 37-43 μm;

a quantity of the semiconductor branches of the second oxide thin-film transistor is four, a quantity of the source branches is two, a quantity of the drain branches is one, the $D_{total\ channel\ quantity}$ is eight, the width of each of the semiconductor branches is $(1/8) * W_{total}$, and a spacing between the semiconductor branches is between 6-10 μm; and the one of the semiconductor branches extends from one of the source branches via the drain branch to another of the source branches, and contacts the source branches and the drain branch; or the $W_{total}$ of the second oxide thin-film transistor is between 48-52 μm;

a quantity of the semiconductor branches of the second oxide thin-film transistor is one, a quantity of the source branches is two, a quantity of the drain branches is one, and the one of the semiconductor branches extends from one of the source branches via the drain branch to another of the source branches and contacts the source branches and the drain branch; and the width of the semiconductor branch is a half of the $W_{total}$ of the second oxide thin-film transistor, the $D_{total\ channel\ quantity}$ is two, and the width of the semiconductor branch is between 24-26 μm.

Optionally, the shift-register unit comprises a third oxide thin-film transistor located between the pull-down node and the low-level reference-voltage terminal, a grid of the third oxide thin-film transistor is connected to an inputting terminal of the shift-register unit, and a source and a drain of the third oxide thin-film transistor are connected to the pull-down node and the low-level reference-voltage terminal respectively;

a quantity of the third oxide thin-film transistor is one or two; and each of the third oxide thin-film transistors comprises one source branch, one drain branch and one semiconductor branch, and a width W of the semiconductor branch is between 18-22 μm.

Optionally, the shift-register unit comprises a fourth oxide thin-film transistor, a source and a drain of the fourth oxide thin-film transistor are connected to a pull-up node and the low-level reference-voltage terminal respectively, and a grid is connected to the pull-down node;

a quantity of the fourth oxide thin-film transistor is one or two;

a quantity of semiconductor branches of the fourth oxide thin-film transistor is one or two, quantities of the source branches and the drain branches are two individually, and the $D_{total\ channel\ quantity}$ is three or six; and when a quantity of the semiconductor branches is two, a width of each of the semiconductor branches is between 20-25 μm, and a spacing between the semiconductor branches is between 10-14 μm; or when a quantity of the semiconductor branches is one, a width of the semiconductor branch is between 40-50 μm.

Optionally, the shift-register unit comprises a fifth oxide thin-film transistor, a source and a drain of the fifth oxide thin-film transistor are connected to a first outputting terminal of the shift-register unit and the low-level reference-voltage terminal respectively, and a grid is connected to the pull-down node;

a quantity of the fifth oxide thin-film transistor is one or two; and each of the fifth oxide thin-film transistors comprises one source branch, one drain branch and one semiconductor branch, and a width W of the semiconductor branch is between 8-12 μm.

Optionally, the shift-register unit comprises a sixth oxide thin-film transistor, a source and a grid of the sixth oxide thin-film transistor are connected to an inputting terminal of the shift-register unit, and a drain is connected to a pull-up node;

a quantity of the sixth oxide thin-film transistor is one, the sixth oxide thin-film transistor comprises three source branches and two drain branches, and the $D_{total\ channel\ quantity}$ is four or eight; and when a quantity of the semiconductor branches is two, a width W of each of the semiconductor branches is between 15-20 μm, and a spacing between the semiconductor branches is between 10-14 μm; or when a quantity of the semiconductor branches is one, a width W of the semiconductor branch is between 30-40 μm.

Optionally, the shift-register unit comprises a seventh oxide thin-film transistor, a source and a drain of the seventh oxide thin-film transistor are connected to the pull-up node of the shift-register unit and the low-level reference-voltage terminal respectively, and a grid is connected to a frame resetting terminal of the shift-register unit; and a quantity of the seventh oxide thin-film transistor is one, the seventh oxide thin-film transistor comprises one source branch, one drain branch and one semiconductor branch, and a width W of the semiconductor branch is between 8-12 μm.

Optionally, the shift-register unit comprises an eighth oxide thin-film transistor, a source and a drain of the eighth oxide thin-film transistor are connected to the pull-up node of the shift-register unit and the low-level reference-voltage terminal respectively, and a grid is connected to a first resetting terminal of the shift-register unit; and a quantity of the eighth oxide thin-film transistor is one, the eighth oxide thin-film transistor comprises one source branch, one drain branch and one semiconductor branch, and a width W of the semiconductor branch is between 22-28 μm.

Optionally, the shift-register unit comprises a ninth oxide thin-film transistor, a source and a drain of the ninth oxide thin-film transistor are connected to a second outputting terminal of the shift-register unit and the low-level reference-voltage terminal respectively, and a grid is connected to the pull-down node;

a quantity of the ninth oxide thin-film transistor is one or two;

a quantity of the semiconductor branches of each of the ninth oxide thin-film transistors is one or two, quantities of the source branches and the drain branches are one individually, and the $D_{total\ channel\ quantity}$ is one or two; and when a quantity of the semiconductor branches is two, a width W of each of the semiconductor branches is between 18-22 μm, and a spacing between the semiconductor branches is between 6-10 μm; or when a quantity of the semiconductor branches is one, a width W of the semiconductor branch is between 36-44 μm.

Optionally, the shift-register unit comprises a tenth oxide thin-film transistor, a source and a drain of the tenth oxide thin-film transistor are connected to a clock-signal terminal and a first outputting terminal of the shift-register unit respectively, and a grid is connected to a pull-up node;

a quantity of the tenth oxide thin-film transistor is one or two;

each of the tenth oxide thin-film transistors comprises six source branches, five drain branches and two semiconductor branches, and the $D_{total\ channel\ quantity}$ is ten or twenty; and when a quantity of the semiconductor branches is two, a width W of each of the semiconductor branches is between 18-22 μm, and a spacing between the semiconductor branches is between 10-14 μm; or when a quantity of the semiconductor branches is one, a width W of the semiconductor branch is between 36-44 μm.

Optionally, the shift-register unit comprises an eleventh oxide thin-film transistor, a source and a drain of the eleventh oxide thin-film transistor are connected to the clock-signal terminal and a second outputting terminal of the shift-register unit respectively, and a grid is connected to the pull-up node;

a quantity of the eleventh oxide thin-film transistor is one, the eleventh oxide thin-film transistor comprises seven source branches, seven drain branches and sixteen semiconductor branches, the $D_{total\ channel\ quantity}$ is one hundred and twenty-one, a width W of each of the semiconductor branches is between 3-6 μm, and a spacing between the semiconductor branches is between 6-10 μm;

a length in an extension direction of the semiconductor branches of eight of the semiconductor branches of the eleventh oxide thin-film transistor that are away from a displaying region of the display panel is greater than a length in the extension direction of the semiconductor branches of eight of the semiconductor branches of the eleventh oxide thin-film transistor that are close to the displaying region of the display panel; and among the eight of the semiconductor branches of the eleventh oxide thin-film transistor that are away from the displaying region of the display panel, all of quantities of channels of each of the semiconductor branches are 13, and among the eight of the semiconductor branches of the eleventh oxide thin-film transistor that are close to the displaying region of the display panel, all of quantities of channels of each of the semiconductor branches are 12.

Optionally, the shift-register unit comprises a twelfth oxide thin-film transistor, a source and a drain of the twelfth oxide thin-film transistor are connected to the second outputting terminal and the low-level reference-voltage terminal of the shift-register unit respectively, and a grid is connected to a second resetting terminal of the shift-register unit; and a quantity of the twelfth oxide thin-film transistor is one, the twelfth oxide thin-film transistor comprises one source branch, one drain branch and one semiconductor branch, and a width W of the semiconductor branch is between 18-22 μm.

Optionally, the grid of the oxide thin-film transistor extends in an extension direction of the corresponding semiconductor branch and overlaps with the semiconductor branch.

Optionally, the grid of the at least some of the oxide thin-film transistors comprises one or more grid branches, each of the grid branches corresponds to at least one of the semiconductor branches, and one of the grid branches extends in an extension direction of one corresponding instance of the semiconductor branches and overlaps with the semiconductor branch; and the grid branches of a same oxide thin-film transistors are electrically connected to each other.

Optionally, in the grid branches and the semiconductor branches of the same oxide thin-film transistors, a sum of widths of the grid branches is slightly greater than a sum of widths of the semiconductor branches.

Optionally, the shift-register unit further comprises one or more dummy electrodes; and the dummy electrodes are located between at least some of the neighboring source branches and drain branches of at least some of the oxide thin-film transistors, the dummy electrodes, the source branches and the drain branches are formed by patterning of a same one film layer, and the dummy electrodes are not electrically connected to any electrically conductive pattern.

Optionally, at least the first oxide thin-film transistor, the second oxide thin-film transistor and the third oxide thin-film transistor of the shift-register unit are located in an adhesive-frame region of the substrate of the display panel; the source branches and the drain branches of the first oxide thin-film transistor, the second oxide thin-film transistor and the third oxide thin-film transistor extend in a direction perpendicular to an edge of the substrate;

the first oxide thin-film transistor and the second oxide thin-film transistor are arranged sequentially in the direction perpendicular to the edge of the substrate;

the first oxide thin-film transistor and the third oxide thin-film transistor are individually one, and are located on a same side of the second oxide thin-film transistor; or the first oxide thin-film transistor and the third oxide thin-film transistor are individually two, one pair of the first oxide thin-film transistor and the third oxide thin-film transistor are located on one side of the second oxide thin-film transistor, and the other pair of the first oxide thin-film transistor and the third oxide thin-film transistor are located on the other side of the second oxide thin-film transistor;

the one pair of the first oxide thin-film transistor and the third oxide thin-film transistor located on the one side of the second oxide thin-film transistor are arranged sequentially in the direction perpendicular to the edge of the substrate, and the other pair of the first oxide thin-film transistor and the third oxide thin-film transistor located on the other side of the second oxide thin-film transistor are arranged sequentially in a direction of the edge of the substrate; and the two pairs of the first oxide thin-film transistor and the third oxide thin-film transistor are arranged sequentially in the direction of the edge of the substrate.

Optionally, the first oxide thin-film transistor, the second oxide thin-film transistor and the third oxide thin-film transistor are individually two;

one first oxide thin-film transistor, an electrode terminal of the shift-register unit, another first oxide thin-film transistor and one third oxide thin-film transistor are arranged sequentially into one row in the direction of the edge of the substrate; and another third oxide thin-film transistor, one second oxide thin-film transistor, another second oxide thin-film transistor and the electrode terminal of the shift-register unit are arranged sequentially into one row in the direction of the edge of the substrate.

Optionally, the sixth oxide thin-film transistor, the seventh oxide thin-film transistor and the ninth oxide thin-film transistor are arranged sequentially in a direction of an edge of the substrate;

the sixth oxide thin-film transistor, the eighth oxide thin-film transistor and the ninth oxide thin-film transistor are arranged sequentially in the direction of the edge of the substrate;

the seventh oxide thin-film transistor and the eighth oxide thin-film transistor are arranged sequentially in a direction perpendicular to the edge of the substrate; and the fifth oxide thin-film transistor and the sixth oxide thin-film transistor are arranged sequentially in the direction perpendicular to the edge of the substrate, the fifth oxide thin-film transistor and the seventh oxide thin-film transistor are arranged sequentially in the direction perpendicular to the edge of the substrate, the fifth oxide thin-film transistor and the eighth oxide thin-film transistor are arranged sequentially in the direction perpendicular to the edge of the substrate, and the fifth oxide thin-film transistor and the ninth oxide thin-film transistor are arranged sequentially in the direction perpendicular to the edge of the substrate.

Optionally, a quantity of the fifth oxide thin-film transistor are two, and an electrode terminal of the shift-register unit, one of the fifth oxide thin-film transistors and the other of the fifth oxide thin-film transistors are arranged sequentially into one row in the direction of the edge of the substrate.

Optionally, the tenth oxide thin-film transistor and the eleventh oxide thin-film transistor are arranged sequentially in the direction perpendicular to an edge of the substrate, and the tenth oxide thin-film transistor and the twelfth oxide thin-film transistor are arranged sequentially in the direction perpendicular to the edge of the substrate; and the eleventh oxide thin-film transistor and the twelfth oxide thin-film transistor are arranged sequentially in the direction of the edge of the substrate.

Optionally, an electrode terminal of the shift-register unit and the tenth oxide thin-film transistor are arranged sequentially into one row in the direction of the edge of the substrate.

The present disclosure further discloses a grid driving circuit, wherein the grid driving circuit comprises a plurality of shift-register units that are cascaded, and each of the shift-register units is the shift-register unit stated above.

The present disclosure further discloses a displaying device, wherein the displaying device comprises a pixel circuit, and the grid driving circuit stated above.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly described below. Apparently, the figures that are described below are embodiments of the present disclosure, and a person skilled in the art can obtain other figures according to these figures without paying creative work.

FIGS. 3a, 3b, 3c, 3d and 3e show results of experimentation on the voltages of some of the nodes of a shift-register unit according to an embodiment of the present disclosure;

FIG. 4 shows a diagram of the outputted waveform of a shift-register unit according to an embodiment of the present disclosure;

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Unless defined otherwise, the technical terminologies or scientific terminologies used in the present disclosure should have the meanings generally understood by a person skilled in the art of the present disclosure. The words used herein such as "first" and "second" do not indicate any sequence, quantity or priority, but are merely intended to distinguish different components. Likewise, the words such as "a", "an" or "the" do not indicate quantitative limitations, but indicate the existence of at least one instance. The words such as "comprise" or "include" mean that the element or article preceding the word encompasses the elements or articles and the equivalents thereof that are listed subsequent to the word, but do not exclude other elements or articles. The words such as "connect" or "couple" are not limited to physical or mechanical connections, but may include electric connections, regardless of direct connections or indirect connections. The orientation terms such as "upper", "lower", "left" and "right" are merely intended to indicate relative positions on the basis of the figures, and if the absolute position of the described item has changed, the relative positions might also be correspondingly changed.

Table 1 shows comparison between the parameters of a polycrystalline silicon and an oxide, wherein the polycrystalline silicon is a-Si, and the oxide is IGZO (indium gallium zinc oxide). Referring to Table 1, the oxide has a higher mobility, a lower leakage current ($I_{off}$, also referred to as off-state current) and a better uniformity, and may be used in high PPI (pixel density) display products. When oxides are used as a semiconductor material, it is required to prevent the influence on the semiconductor by heat generation.

TABLE 1

|  | a-Si | IGZO |
| --- | --- | --- |
| Mobility (cm²/V · S) | <1 | 1-50 |
| $I_{on}$ (on-state current)/ $I_{off}$ (leakage current) | $10^6$ | $10^8$ |
| Uniformity | good | good |
| Suitable resolution | ≤350 PPI | ≤450 PPI |

Figure 1:
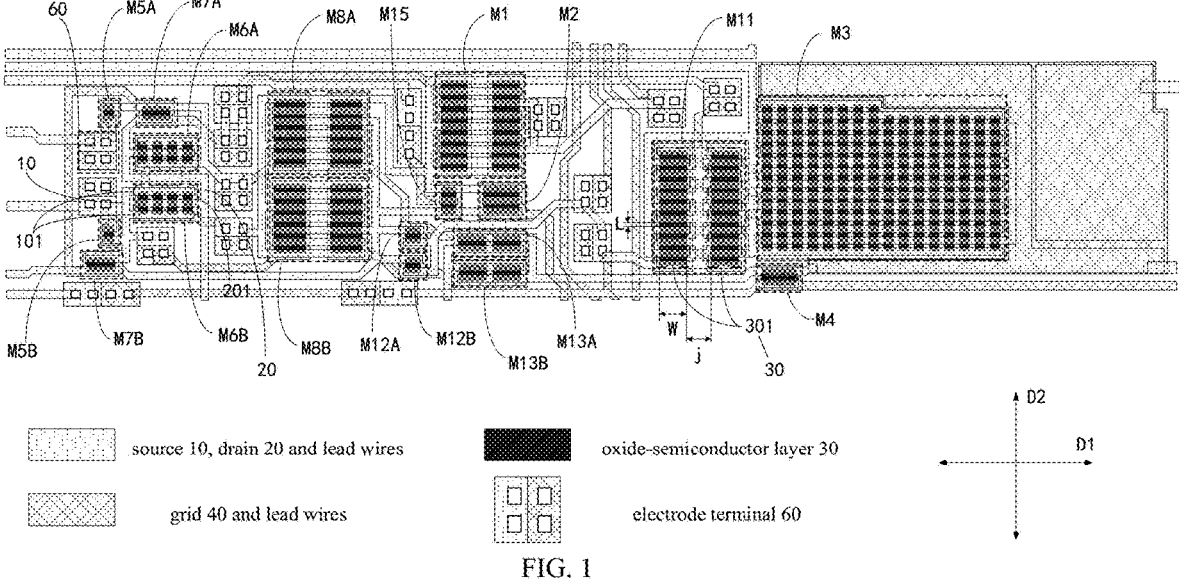
FIG. 1 shows a top view of the film layers of a shift-register unit according to an embodiment of the present disclosure.

FIG. 1 shows a top view of the film layers of a shift-register unit (Gate On Array, GOA) according to an embodiment of the present disclosure, wherein the shift-register unit is used to drive a pixel circuit. Referring to FIG. 1, a shift-register unit 1000 is located on a substrate of a display panel, and located in a non-displaying region, and comprises a plurality of oxide thin-film transistors M, and each of the oxide thin-film transistors M comprises an oxide-semiconductor layer 30 and a source 10 and a drain 20 that are connected to the oxide-semiconductor layer 30 and are separately provided.

Each of the source 10 and the drain 20 of at least some of the oxide thin-film transistors has a plurality of branches. The source 10 comprises a plurality of source branches 101 extending in a first direction D1, and the drain 20 comprises a plurality of drain branches 201 extending in the first direction D1. The source branches 101 and the drain branches 201 face each other and sequentially intersect in a second direction D2.

The oxide-semiconductor layer 30 has at least one semiconductor branch 301 or a plurality of semiconductor branches 301 that are separately and parallelly distributed, each of the semiconductor branches 301 extends in the second direction perpendicular to the extension direction of the drain 20 and overlaps with and is electrically connected to the source branches 101 and the drain branches 201, and the width of the semiconductor branch 301 that overlaps with any neighboring source branch 101 and drain branch 201 is the distance W of the semiconductor branch 301 from one end to the other end in the first direction D1.

The at least some of the oxide thin-film transistors M are a plurality of oxide thin-film transistors, and the widths W of the semiconductor branches 301 of different oxide thin-film transistors M are not completely equal.

In practical applications, the oxide-semiconductor layer of the oxide thin-film transistor M may be delimited into one or more semiconductor branches according to the width $W_{total}$ of the oxide semiconductor required by the oxide thin-film transistor M, wherein the sum of the widths W of the discrete semiconductor branches obtained by the delimitation is equal to $W_{total}$. Accordingly, one oxide thin-film transistor can realize the required total channel width $W_{total}$ by using the one or more semiconductor branches, to ensure the normal operation of the oxide thin-film transistor M, whereby the oxide-semiconductor layers of the different oxide thin-film transistors can be configured differently, to realize the purpose of reducing the border frame of the displaying device. Moreover, the semiconductor branches of a lower size and the gaps between the semiconductor branches can be used for heat dissipation, thereby preventing failure of the oxide thin-film transistors caused by heat accumulation of the oxide semiconductor.

In some alternative embodiments, the oxide-semiconductor layers may be IGZO semiconductor layers.

Optionally, in some embodiments, the width W of each of the semiconductor branches 301 of the at least some of the oxide thin-film transistors M is not less than 3 μm, and not greater than 60 μm.

The width of the grid of the oxide thin-film transistor M can decide the effect of the solidification of the packaging adhesive in the non-displaying region, and the width of the grid is related to the width of the oxide-semiconductor layer (i.e., the width of the semiconductor branch). Therefore, when the width W of the semiconductor branch 301 is not less than 3 μm and not greater than 60 μm, the width of the grid is slightly greater than 60 μm. Accordingly, the effect of the solidification of the packaging adhesive in the non-displaying region can be ensured.

Figure 2:
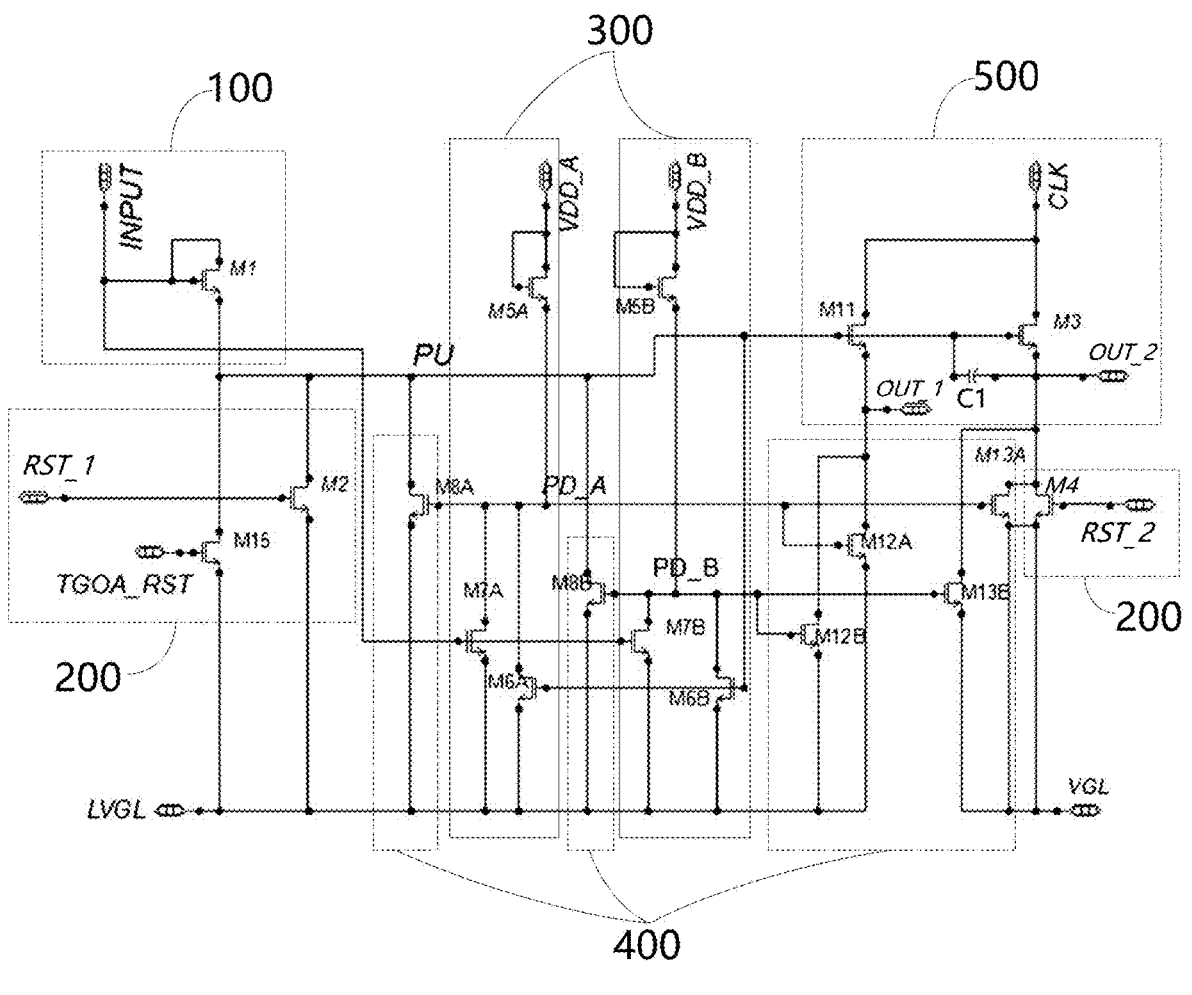
FIG. 2 shows a circuit diagram corresponding to a shift-register unit according to an embodiment of the present disclosure.

FIG. 2 is a circuit diagram corresponding to the shift-register unit shown in FIG. 1. Referring to FIG. 2, optionally, in some embodiments, the shift-register unit comprises a pull-down controlling circuit 300, and the pull-down controlling circuit 300 comprises: a first oxide thin-film transistor M5 located between a pull-down node PD and a high-level reference-voltage terminal VDD, and a second oxide thin-film transistor M6 located between the pull-down node PD and a low-level reference-voltage terminal LVGL;

each of the oxide thin-film transistors satisfies the following formula: $W_{total} = D_{total\ channel\ quantity} * W$;

where W is the width of each of the semiconductor branches, $D_{total\ channel\ quantity}$ is the sum of the quantities of the channels of the semiconductor branches between the source branches and the neighboring drain branches in each of the oxide thin-film transistors, and $W_{total}$ is the total width of the channels; and the ratio of $W_{total}$ of the first oxide thin-film transistor M5 to $W_{total}$ of the second oxide thin-film transistor M6 is between 0.05-0.17.

The source and the grid of the first oxide thin-film transistor M5 are connected to the high-level reference-voltage terminal VDD, and the drain is connected to the pull-down node PD. The source and the drain of the second oxide thin-film transistor M6 are connected to the pull-down node PD and the low-level reference-voltage terminal LVGL respectively, and the grid is connected to a pull-up node PU.

In some embodiments, the shift-register unit may comprise an inputting circuit 100, a resetting circuit 200, a pull-down controlling circuit 300, a pull-down circuit 400 and an outputting circuit 500. The shift-register unit of the 18T1C (18 oxide thin-film transistors and 1 capacitor) architecture shown in FIG. 2 will be taken as an example below for the description in detail, wherein all of the oxide thin-film transistors in the 18T1C shift-register unit are the oxide thin-film transistor having the oxide semiconductor according to the present disclosure.

Referring to FIG. 2, the inputting circuit 100 comprises the oxide thin-film transistor M1. The inputting circuit 100 may, in response to an inputted signal from an inputting terminal INPUT, control the voltage of the pull-up node PU.

Referring to FIG. 2, the resetting circuit 200 comprises oxide thin-film transistors M2, M4, M15. The resetting circuit 200 may, in response to a resetting signal from a first resetting terminal RST_1, reset the pull-up node PU, may also, in response to a resetting signal from a second resetting terminal RST_2, reset a second outputting terminal OUT_2, and may also, in response to a frame resetting signal from a frame resetting terminal TGOA_RST, reset the pull-up node PU.

Referring to FIG. 2, the pull-down circuit 400 comprises oxide thin-film transistors M8, M12, M13. The pull-down circuit 400 may, in response to an effective voltage of the pull-down node PD, pull down the voltage of the pull-up node PU, the voltage of the second outputting terminal OUT_2 and the voltage of a first outputting terminal OUT_1.

Referring to FIG. 2, the outputting circuit 500 comprises oxide thin-film transistors M3, M11 and a capacitor C1. The outputting circuit 500 may, in response to a clock signal from a clock-signal terminal CLK, output the clock signal to the first outputting terminal OUT_1 and the second outputting terminal OUT_2, i.e., providing a grid driving signal to the pixel circuit of the row where the shift-register unit is located. The outputting circuit 500 may also, in response to a clock signal from the clock-signal terminal CLK, provide a resetting signal to the upper stage of shift-register unit, and provide an inputted signal to the lower stage of shift-register unit.

Referring to FIG. 2, the pull-down controlling circuit 300 comprises oxide thin-film transistors M5, M6, M7. The pull-down controlling circuit 300 may, in response to a first power-supply signal of a first power-supply terminal VDD, an inputted signal of the inputting terminal INPUT, the voltage of the pull-up node PU and a second power-supply signal of a second power-supply terminal LVGL, control the voltage of the pull-down node PD. The oxide thin-film transistor M5 is the first oxide thin-film transistor M5 described above, and the oxide thin-film transistor M6 is the second oxide thin-film transistor M6 described above.

The ratio of the total channel width $W_{total}$ of the first oxide thin-film transistor M5 to the total channel width $W_{total}$ of the second oxide thin-film transistor M6 may be greater than or equal to 1:8.

Optionally, the $W_{total}$ of the first oxide thin-film transistor is not less than 3 μm, and the $W_{total}$ of the second oxide thin-film transistor is not greater than 60 μm.

It is obtained by experimentation that the ratio of the semiconductor widths of the oxide thin-film transistor M5 to the oxide thin-film transistor M6 (expressed as M5/6 in the figures and tables) highly influences the maintaining of the bootstrapping voltage of the pull-up node PU, wherein the related part of the experimentation result may refer to FIGS. 3a, 3b, 3c, 3d and 3e. The following Table 2 further shows the data of the bootstrapping-voltage peaks of the pull-up node PU and the PU retention rates when different ratios of the semiconductor widths of M5 to M6 (1:6, 1:7, 1:8, 1:10, 1:12 and 1:14) are used. FIG. 3a is oscillograms of the pull-up node PU and the pull-down node PD when different ratios of the semiconductor widths of M5 to M6 (1:6, 1:8, 1:10, 1:12 and 1:14) are used, and FIGS. 3b, 3c, 3d and 3e are diagrams of local waveform details of FIG. 3a.

TABLE 2

| M5/6 | 1:6 | 1:7 | 1:8 | 1:10 | 1:12 | 1:14 |
|---|---|---|---|---|---|---|
| PU retention rate | 72.3% | 87.13% | 91.21% | 93.8% | 94.17% | 94.23% |
| Peak voltage after PU bootstrapping | 35.2 V | 36.85 V | 37.13 V | 37.2 V | 36.99 V | 36.5 V |

Referring to FIG. 3b, when the ratios of the semiconductor widths of M5 to M6 are different, the low level of the pull-down node PD is approximately −10V and −11V. Referring to FIG. 3d, when the ratios of the semiconductor widths of M5 to M6 are different, the high-level stage of the pull-down node PD has substantially no difference. Therefore, when the ratios of the semiconductor widths of M5 to M6 are different, that substantially does not adversely affect the voltage of the pull-down node PD.

Referring to FIG. 3a, the pull-up node PU bootstraps after a duration of a high level. Referring to FIG. 3c, when the ratios of the semiconductor widths of M5 to M6 are different, the high-level stage of the pull-up node PU before the bootstrapping is different, wherein when M5/6 is =1:6, the high level of the pull-up node PU before the bootstrapping obviously decreases. However, referring to FIG. 3c and Table 2, when the ratios of the semiconductor widths of M5 to M6 are different, the peak voltage and the PU retention rate of the pull-up node PU after the bootstrapping are also different, wherein when M5/6<1:8, the PU retention rate is not greater than 88%, while when M5/6≥1:8, the PU retention rate is not less than 90%. In particular applications, the PU retention rate is required to be maintained not less than 88%, or else the outputs of the shift-register units of different rows are different. Therefore, in the embodiments of the present disclosure, the ratio of the semiconductor widths of M5 to M6 is required to be greater than or equal to 1:8, and if it is less than 1:8, the problem easily happens that the voltage of the pull-up node PU is maintained inadequately.

FIG. 4 shows a diagram of the outputted waveform of the 18T1C shift-register unit. Referring to FIG. 4, it can be seen from a time reliability experimentation that the OUT_1 outputted waveforms of the 18T1C shift-register unit at 100 H (hour), 200 H, 500 H, 1000 H and 5000 H are substantially the same, and the noise part has no abnormality, which indicates that, by using the semiconductor design of the present disclosure, the 18T1C shift-register unit can operate normally.

Further optionally, in some embodiments, the ratio of the total channel width $W_{total}$ of the first oxide thin-film transistor M5 to the total channel width $W_{total}$ of the second oxide thin-film transistor M6 may be less than or equal to 1:14. The ratio of the total channel widths $W_{total}$ of the first oxide thin-film transistor M5 to the second oxide thin-film transistor M6, if satisfies the demand on the maintaining of the voltage of the pull-up node PU, is not required to be excessively high. That can reduce the room occupied by the shift-register unit, and also can prevent waste of the material of the oxide thin-film transistors. Comprehensively taking into consideration the life of the border frame, in some particular embodiments, the ratio of the total channel widths $W_{total}$ of the first oxide thin-film transistor M5 to the second oxide thin-film transistor M6 may be 1:8.

Further optionally, the pull-down controlling circuit has one or two pull-down nodes, the quantity of the first oxide thin-film transistor is one or two oxide thin-film transistors that are correspondingly connected to the pull-down nodes one to one, and the quantity of the second oxide thin-film transistor is one or two oxide thin-film transistors that are correspondingly connected to the pull-down nodes one to one;

in the two first oxide thin-film transistors, the channel lengths are equal, the widths of the semiconductor branches are equal, the quantities of the semiconductor branches are equal, and the spacings between the neighboring semiconductor branches are equal; and in the two second oxide thin-film transistors, the channel lengths are equal, the widths of the semiconductor branches are equal, the quantities of the semiconductor branches are equal, and the spacings between the neighboring semiconductor branches are equal.

In other words, in some embodiments, the shift-register unit may comprise two pull-down nodes PD and two pull-down controlling circuits 300, the pull-down controlling circuits 300 and the pull-down nodes PD are connected correspondingly one to one, and the two pull-down controlling circuits 300 are configured to operate alternately.

In some embodiments, the shift-register unit may be of a double-VDD architecture. In other words, the shift-register unit may comprise two high-level reference-voltage terminals VDD (for example, VDD_A and VDD_B in FIG. 2), wherein the active levels of VDD_A and VDD_B are alternately performed, whereby the two pull-down controlling circuits 300 are configured to operate alternately. Correspondingly, the shift-register unit may further comprise two pull-down nodes PD (for example, PD_A and PD_B in FIG. 2) and two pull-down controlling circuits 300, wherein all of the pull-down controlling circuits 300, the pull-down nodes PD and the high-level reference-voltage terminals VDD are connected correspondingly one to one. Particularly, the oxide thin-film transistor M5 particularly comprises the oxide thin-film transistors M5A, M5B, the oxide thin-film transistor M6 particularly comprises the oxide thin-film transistors M6A, M6B, and the oxide thin-film transistor M7 particularly comprises the oxide thin-film transistors M7A, M7B. In addition, because two pull-down nodes PD exist, in the pull-down circuit 400 the oxide thin-film transistor M8 may particularly comprise oxide thin-film transistors M8A, M8B, the oxide thin-film transistor M12 may particularly comprise oxide thin-film transistors M12A, M12B, and the oxide thin-film transistor M13 may particularly comprise oxide thin-film transistors M13A, M13B.

In some alternative embodiments, as shown in FIG. 1, the quantity of the semiconductor branches of each of the first oxide thin-film transistors M5 is one, the quantities of the source branches and the drain branches are one individually, the width of each of the semiconductor branches is 3-6 μm, and the width of the semiconductor branches is the total width of the channels of the first oxide thin-film transistor M5.

In some alternative embodiments, as shown in FIG. 1, the $W_{total}$ of the second oxide thin-film transistor is between 37-43 μm;

the quantity of the semiconductor branches of the second oxide thin-film transistor is four, the quantity of the source branches is two, the quantity of the drain branches is one, the $D_{total\ channel\ quantity}$ is eight, the width of each of the semiconductor branches is (⅛) *$W_{total}$, and the spacing between the semiconductor branches is between 6-10 μm; and the one of the semiconductor branches extends from one of the source branches via the drain branch to another of the source branches, and contacts the source branches and the drain branch; or the $W_{total}$ of the second oxide thin-film transistor is between 48-52 μm;

in a case, the quantity of the semiconductor branches of the second oxide thin-film transistor is one, the quantity of the source branches is two, the quantity of the drain branches is one, and the one of the semiconductor branches extends from one of the source branches via the drain branch to another of the source branches and contacts the source branches and the drain branch; and in another case, the width of the semiconductor branch is a half of the $W_{total}$ of the second oxide thin-film transistor, the $D_{total\ channel\ quantity}$ is two, and the width of the semiconductor branch is between 24-26 μm.

Optionally, in some embodiments, the shift-register unit comprises a third oxide thin-film transistor M7 located between the pull-down node PD and the low-level reference-voltage terminal LVGL, the grid of the third oxide thin-film transistor M7 is connected to the inputting terminal INPUT of the shift-register unit, and the source and the drain of the third oxide thin-film transistor M7 are connected to the pull-down node PD and the low-level reference-voltage terminal LVGL respectively;

the quantity of the third oxide thin-film transistor M7 is one or two; and each of the third oxide thin-film transistors M7 comprises one source branch, one drain branch and one semiconductor branch, and the width W of the semiconductor branch is between 18-22 μm.

Besides the above-described oxide thin-film transistors, the other oxide thin-film transistors in the shift-register unit may also have customized design of the oxide-semiconductor layer, which will be described in detail below.

In some embodiments, the shift-register unit comprises a fourth oxide thin-film transistor M8, the source and the drain of the fourth oxide thin-film transistor M8 are connected to the pull-up node PU and the low-level reference-voltage terminal respectively LVGL, and the grid is connected to the pull-down node PD;

the quantity of the fourth oxide thin-film transistor M8 is one or two;

the quantity of semiconductor branches of the fourth oxide thin-film transistor M8 is one or two, the quantities of the source branches and the drain branches are two individually, and the $D_{total\ channel\ quantity}$ is three or six; and when the quantity of the semiconductor branches is two, the width of each of the semiconductor branches is between 20-25 μm, and the spacing between the semiconductor branches is between 10-14 μm; or when the quantity of the semiconductor branches is one, the width of the semiconductor branch is between 40-50 μm.

In some embodiments, the shift-register unit comprises a fifth oxide thin-film transistor M12, the source and the drain of the fifth oxide thin-film transistor M12 are connected to the first outputting terminal OUT_1 of the shift-register unit and the low-level reference-voltage terminal LVGL respectively, and the grid is connected to the pull-down node PD;

the quantity of the fifth oxide thin-film transistor M12 is one or two; and each of the fifth oxide thin-film transistors M12 comprises one source branch, one drain branch and one semiconductor branch, and the width W of the semiconductor branch is between 8-12 μm.

In some embodiments, the shift-register unit comprises a sixth oxide thin-film transistor M1, the source and the grid of the sixth oxide thin-film transistor M1 are connected to the inputting terminal INPUT of the shift-register unit, and the drain is connected to the pull-up node PU;

the quantity of the sixth oxide thin-film transistor M1 is one, the sixth oxide thin-film transistor M1 comprises three source branches and two drain branches, and the $D_{total\ channel\ quantity}$ is four or eight; and when the quantity of the semiconductor branches is two, the width W of each of the semiconductor branches is between 15-20 μm, and the spacing between the semiconductor branches is between 10-14 μm; or when the quantity of the semiconductor branches is one, the width W of the semiconductor branch is between 30-40 μm.

In some embodiments, the shift-register unit comprises a seventh oxide thin-film transistor M15, the source and the drain of the seventh oxide thin-film transistor M15 are connected to the pull-up node PU of the shift-register unit and the low-level reference-voltage terminal LVGL respectively, and the grid is connected to a frame resetting terminal TGOA_RST of the shift-register unit; and the quantity of the seventh oxide thin-film transistor M15 is one, the seventh oxide thin-film transistor M15 comprises one source branch, one drain branch and one semiconductor branch, and the width W of the semiconductor branch is between 8-12 μm.

In some embodiments, the shift-register unit comprises an eighth oxide thin-film transistor M2, the source and the drain of the eighth oxide thin-film transistor M2 are connected to the pull-up node PU of the shift-register unit and the low-level reference-voltage terminal LVGL respectively, and the grid is connected to a first resetting terminal RST_1 of the shift-register unit; and the quantity of the eighth oxide thin-film transistor M2 is one, the eighth oxide thin-film transistor M2 comprises one source branch, one drain branch and one semiconductor branch, and the width W of the semiconductor branch is between 22-28 μm.

In some embodiments, the shift-register unit comprises a ninth oxide thin-film transistor M13, the source and the drain of the ninth oxide thin-film transistor M13 are connected to the second outputting terminal OUT_2 of the shift-register unit and the low-level reference-voltage terminal VGL respectively, and the grid is connected to the pull-down node PD;

the quantity of the ninth oxide thin-film transistor M13 is one or two;

the quantity of the semiconductor branches of each of the ninth oxide thin-film transistors M13 is one or two, the quantities of the source branches and the drain branches are one individually, and the $D_{total\ channel\ quantity}$ is one or two; and when the quantity of the semiconductor branches is two, the width W of each of the semiconductor branches is between 18-22 μm, and the spacing between the semiconductor branches is between 6-10 μm; or when the quantity of the semiconductor branches is one, the width Q of the semiconductor branch is between 36-44 μm.

Both of the low-level reference-voltage terminal VGL and the low-level reference-voltage terminal LVGL are used to provide a low-level reference voltage, and have the same function in practical applications, and may be connected according to practical situations, and the present disclosure does not intend to limit them.

In some embodiments, the shift-register unit comprises a tenth oxide thin-film transistor M11, the source and the drain of the tenth oxide thin-film transistor M11 are connected to the clock-signal terminal CLK and the first outputting terminal of the shift-register unit respectively, and the grid is connected to the pull-up node PU;

the quantity of the tenth oxide thin-film transistor M11 is one or two;

each of the tenth oxide thin-film transistors M11 comprises six source branches, five drain branches and two semiconductor branches, and the $D_{total\ channel\ quantity}$ is ten or twenty; and when the quantity of the semiconductor branches is two, the width W of each of the semiconductor branches is between 18-22 μm, and the spacing between the semiconductor branches is between 10-14 μm; or when the quantity of the semiconductor branches is one, the width W of the semiconductor branch is between 36-44 μm.

In some embodiments, the shift-register unit comprises an eleventh oxide thin-film transistor M3, the source and the drain of the eleventh oxide thin-film transistor M3 are connected to the clock-signal terminal CLK and the second outputting terminal OUT_2 of the shift-register unit respectively, and the grid is connected to the pull-up node PU;

the quantity of the eleventh oxide thin-film transistor M3 is one, the eleventh oxide thin-film transistor M3 comprises seven source branches, seven drain branches and sixteen semiconductor branches, the $D_{total\ channel\ quantity}$ is one hundred and twenty, the width W of each of the semiconductor branches is between 3-6 μm, and the spacing between the semiconductor branches is between 6-10 μm;

referring to FIG. 1, the length in the extension direction of the semiconductor branches of eight of the semiconductor branches of the eleventh oxide thin-film transistor M3 that are away from the displaying region of the display panel is greater than the length in the extension direction of the semiconductor branches of eight of the semiconductor branches of the eleventh oxide thin-film transistor M3 that are close to the displaying region of the display panel; and among the eight of the semiconductor branches of the eleventh oxide thin-film transistor M3 that are away from the displaying region of the display panel, all of the quantities of the channels of each of the semiconductor branches are 13, and among the eight of the semiconductor branches of the eleventh oxide thin-film transistor M3 that are close to the displaying region of the display panel, all of the quantities of the channels of each of the semiconductor branches are 12.

In some embodiments, the shift-register unit comprises a twelfth oxide thin-film transistor M4, the source and the drain of the twelfth oxide thin-film transistor M3 are connected to the second outputting terminal OUT_2 and the low-level reference-voltage terminal VGL of the shift-register unit respectively, and the grid is connected to a second resetting terminal RST_2 of the shift-register unit; and the quantity of the twelfth oxide thin-film transistor M3 is one, the twelfth oxide thin-film transistor M3 comprises one source branch, one drain branch and one semiconductor branch, and the width W of the semiconductor branch is between 18-22 μm.

The position relations among the oxide thin-film transistors in the shift-register unit will be described below.

Further optionally, in some embodiments, at least the first oxide thin-film transistor M5, the second oxide thin-film transistor M6 and the third oxide thin-film transistor M7 of the shift-register unit are located in an adhesive-frame region of the substrate of the display panel;

the source branches and the drain branches of the first oxide thin-film transistor M5, the second oxide thin-film transistor M6 and the third oxide thin-film transistor M7 extend in the direction perpendicular to the edge of the substrate;

the first oxide thin-film transistor M5 and the second oxide thin-film transistor M6 are arranged sequentially in the direction perpendicular to the edge of the substrate;

the first oxide thin-film transistor M5 and the third oxide thin-film transistor M7 are individually one, and are located on the same side of the second oxide thin-film transistor M6; or the first oxide thin-film transistor M5 and the third oxide thin-film transistor M7 are individually two, one pair of the first oxide thin-film transistor M5A and the third oxide thin-film transistor M7A are located on one side of the second oxide thin-film transistor M6A, and the other pair of the first oxide thin-film transistor M5B and the third oxide thin-film transistor M7B are located on the other side of the second oxide thin-film transistor M6B;

the one pair of the first oxide thin-film transistor M5A and the third oxide thin-film transistor M7A located on the one side of the second oxide thin-film transistor M6A are arranged sequentially in the direction perpendicular to the edge of the substrate, and the other pair of the first oxide thin-film transistor M5B and the third oxide thin-film transistor M7B located on the other side of the second oxide thin-film transistor M6B are arranged sequentially in the direction of the edge of the substrate; and the two pairs of the first oxide thin-film transistor M5 and the third oxide thin-film transistor M7 are arranged sequentially in the direction of the edge of the substrate.

Further optionally, in some embodiments, the first oxide thin-film transistor M5, the second oxide thin-film transistor M6 and the third oxide thin-film transistor M7 are individually two;

one first oxide thin-film transistor M5, an electrode terminal 60 of the shift-register unit, another first oxide thin-film transistor M5 and one third oxide thin-film transistor M7 are arranged sequentially into one row in the direction of the edge of the substrate (i.e., the second direction D2); and another third oxide thin-film transistor M7, one second oxide thin-film transistor M6, another second oxide thin-film transistor M6 and the electrode terminal 60 of the shift-register unit are arranged sequentially into one row in the direction of the edge of the substrate (i.e., the second direction D2).

Further optionally, in some embodiments, the sixth oxide thin-film transistor M1, the seventh oxide thin-film transistor M15 and the ninth oxide thin-film transistor M13 are arranged sequentially in the direction of the edge of the substrate (i.e., the second direction D2);

the sixth oxide thin-film transistor M1, the eighth oxide thin-film transistor M2 and the ninth oxide thin-film transistor M13 are arranged sequentially in the direction of the edge of the substrate (i.e., the second direction D2);

the seventh oxide thin-film transistor M15 and the eighth oxide thin-film transistor M2 are arranged sequentially in the direction perpendicular to the edge of the substrate (i.e., the first direction D1); and the fifth oxide thin-film transistor M12 and the sixth oxide thin-film transistor M1 are arranged sequentially in the direction perpendicular to the edge of the substrate, the fifth oxide thin-film transistor M12 and the seventh oxide thin-film transistor M15 are arranged sequentially in the direction perpendicular to the edge of the substrate (i.e., the first direction D1), the fifth oxide thin-film transistor M12 and the eighth oxide thin-film transistor M2 are arranged sequentially in the direction perpendicular to the edge of the substrate (i.e., the first direction D1), and the fifth oxide thin-film transistor M12 and the ninth oxide thin-film transistor M13 are arranged sequentially in the direction perpendicular to the edge of the substrate (i.e., the first direction D1).

Further optionally, in some embodiments, the fifth oxide thin-film transistor M12 are two fifth oxide thin-film transistors, and an electrode terminal 60 of the shift-register unit, one of the fifth oxide thin-film transistors M12 and the other of the fifth oxide thin-film transistors M12 are arranged sequentially into one row in the direction of the edge of the substrate.

Further optionally, in some embodiments, the tenth oxide thin-film transistor M11 and the eleventh oxide thin-film transistor M3 are arranged sequentially in the direction perpendicular to the edge of the substrate, and the tenth oxide thin-film transistor M11 and the twelfth oxide thin-film transistor M4 are arranged sequentially in the direction perpendicular to the edge of the substrate; and the eleventh oxide thin-film transistor M3 and the twelfth oxide thin-film transistor M4 are arranged sequentially in the direction of the edge of the substrate.

Further optionally, in some embodiments, an electrode terminal 60 of the shift-register unit and the tenth oxide thin-film transistor M11 are arranged sequentially into one row in the direction of the edge of the substrate.

In the above embodiments, the width of the spacing j between two neighboring semiconductor branches may be greater than 6 μm.

When the spacing j is less than or equal to 6 μm, the drifting speed of Vth (the threshold voltage) of the oxide thin-film transistors increases due to heat generation. Therefore, it is required to set a spacing greater than 6 μm between two neighboring semiconductor branches.

By providing the oxide-semiconductor-layer patterns of different semiconductor-branch widths with the equal total channel widths, the oxide thin-film transistors of the different oxide-semiconductor-layer patterns are tested, to test their Stress (bias voltage) characteristics, and the result of the comparison of the Vth drifting speeds of the different oxide thin-film transistors is shown in the following Table 3, wherein W/L is =1500/8.5=176.5.

It can be understood that Table 3 merely exemplarily shows the result of the test on the oxide thin-film transistors of some oxide-semiconductor-layer patterns.

TABLE 3

| | Grid area (μm²) | $I_{on}$ | 1 h Vth drifting | 2 h Vth drifting | 4 h Vth drifting | 8 h Vth drifting | 8 h $I_{on}$ |
|---|---|---|---|---|---|---|---|
| w = 5 μm | 48374 | 8.7 | 4.2 | 4.64 | 5.27 | 6.01 | 3.58 |
| w = 10 μm | 34304 | 7.9 | 3.54 | 4.00 | 4.51 | 5.15 | 3.71 |
| w = 20 μm | 26724 | 7.2 | 3.25 | 3.74 | 4.28 | 4.97 | 3.82 |
| w = 50 μm | 24525 | 7.8 | 4.1 | 4.57 | 5.18 | 5.91 | 3.48 |

The data in Table 3 show that, when w is 5 μm, 10 μm, 20 μm and 50 μm, Vth has no obvious accelerated drifting at all of the 1 h (hour), 2 h, 4 h and 8 h, and $I_{on}$ has no obvious accelerated decreasing after 8 h. Therefore, regarding the oxide thin-film transistors whose W/L is =1500/8.5=176.5, wherein L is the channel length of the oxide thin-film transistors, the Stress characteristics of the oxide thin-film transistors of the different oxide-semiconductor-layer patterns have no obvious difference. Because, if W is higher, the heat generation of the oxide thin-film transistors is more significant, it can be deduced that, for all of the oxide thin-film transistors whose W/L≤176.5, oxide-semiconductor-layer patterns of unequal semiconductor-branch widths may be employed according to the required total channel widths.

Therefore, optionally, in some oxide thin-film transistors M, the ratio of the total channel width $W_{total}$ to the channel length L may be less than or equal to 176.5. For the oxide thin-film transistors whose W/L≤176.5, different oxide-semiconductor-layer patterns can be employed, which does not obviously affect Vth and $I_{on}$, whereby the Stress characteristics of the oxide thin-film transistors can be ensured.

However, for the oxide thin-film transistors whose W/L>176.5, currently it can merely be determined by experimentation that the oxide-semiconductor-layer pattern in which w is =5 μm and the spacing j between two neighboring semiconductor branches is =7 μm does not obviously affect the Vth drifting speed.

Additionally, as stated above, if $W_{total}$ is higher, the heat generation of the oxide thin-film transistors is more significant. Therefore, further optionally, $W_{total}$ may be less than or equal to 1500 μm, to prevent the oxide thin-film transistors from significantly generating heat, which results in failure.

In an alternative embodiment, the oxide-semiconductor layers of all of the oxide thin-film transistors M may, according to the total channel widths $W_{total}$ and the channel lengths L required by the oxide thin-film transistors M in the circuit, configured to be one or more semiconductor branches whose width is 5 μm, and a spacing of 7 μm may be provided between two neighboring semiconductor branches.

In another alternative embodiment, as shown in FIG. 1, both of M5A and M5B comprise one semiconductor branch 301, and the width W of the semiconductor branch 301 is =5 μm.

Both of M7A and M7B comprise one semiconductor branch 301, and the semiconductor width w of the semiconductor branch 301 is =20 μm.

Both of M6A and M6B comprise 4 semiconductor branches 301, the spacing j between two neighboring semiconductor branches 301 is =7 μm, and the width W of each of the semiconductor branches 301 is =5 μm.

The $W_{total}$ ratio of M5 to M6 may be not less than 1:8. If M5 has one semiconductor branch 301 whose W is =5 μm, and the semiconductor branch 301 has 1 channel, or, in other words, the $W_{total}$ of M5 is =5 μm, then, according to the ratio of 1:8, the $W_{total}$ of M6 is required to be 40 μm.

If M6 has two semiconductor branches 301 whose W is =20 μm, if the process fluctuation deviation is 1 μm, the minimum of the $W_{total}$ of M5 is 4 μm, the minimum of the $W_{total}$ of M6 is (20−1)*2=38, and the ratio M5/6 is =4/38=1: 9.5. The maximum of the $W_{total}$ of M5 is 6 μm, the maximum of the $W_{total}$ of M6 is (20+1)*2=42, and the ratio M5/6 is =6/42=1:7. The ratio M5/6 fluctuates in the range of 1:7-1:9.5, which has the risk of abnormality of the PU retention rate. Therefore, M6 may select 4 semiconductor branches 301 whose W is =5 μm, and each of the semiconductor branches 301 has 2 channels, whereby, regardless of the process fluctuation, the ratio M5/6 is always maintained at 1:8.

Both of M8A and M8B comprise two semiconductor branches 301, each of the semiconductor branches 301 has 3 channels, the spacing j between two neighboring semiconductor branches 301 is =13 μm, and the width W of each of the semiconductor branches 301 is =23.5 μm.

Both of M12A and M12B comprise one semiconductor branch 301, each of the semiconductor branches 301 has one channel, and the width W of the semiconductor branch 301 is =10 μm.

M1 comprises 2 semiconductor branches 301, each of the semiconductor branches 301 has 4 channels, the spacing j between two neighboring semiconductor branches 301 is =13 μm, and the width W of each of the semiconductor branches 301 is =18.75 μm.

M15 comprises one semiconductor branch 301, the semiconductor branch 301 has one channel, and the width W of the semiconductor branch 301 is =10 μm.

M2 comprises one semiconductor branch 301, the semiconductor branch 301 has one channel, and the width W of the semiconductor branch 301 is =25 μm.

Both of M13A and M13B comprise two semiconductor branches 301, each of the semiconductor branches 301 has one channel, the spacing j between two neighboring semiconductor branches 301 is =7 μm, and the width W of each of the semiconductor branches 301 is =20 μm.

M11 comprises two semiconductor branches 301, each of the semiconductor branches 301 has 10 channels, the spacing j between two neighboring semiconductor branches 301 is =13 μm, and the width W of each of the semiconductor branches 301 is =20 μm.

M3 comprises 16 semiconductor branches 301, among the first 8 semiconductor branches 301 each of the semiconductor branches 301 comprises 13 channels, among the last 8 semiconductor branches 301 each of the semiconductor branches 301 comprises 12 channels, the spacing j between two neighboring semiconductor branches 301 is =7 μm, and the width W of the semiconductor branch 301 is =5 μm.

M4 comprises one semiconductor branch 301, each of the semiconductor branches 301 comprises one channel, and the width W of the semiconductor branch 301 is =20 μm.

In the alternative embodiment shown in FIG. 1, the ratios of the total channel width $W_{total}$ to the channel length L of the oxide thin-film transistors may refer to the following Table 4.

TABLE 4

|  | $W_{total}/L$ |
| --- | --- |
| M1 | 12-15 |
| M2 | 2-5 |
| M3 | 180-220 |
| M4 | 4-6 |
| M5A, M5B | 0.8-1.2 |
| M6A, M6B | 4-4.8 |
| M7A, M7B | 3-5 |
| M8A, M8B | 13-15 |
| M11 | 70-90 |
| M12A, M12B | 1-3 |
| M13A, M13B | 7-9 |
| M15 | 0.8-1.2 |

C1: 2-4 pF

It is obtained by experimentation that, by using the 18T1C shift-register unit shown in FIG. 1 and the above parameters, the border frame of the displaying device can be reduced by 0.1 mm (as compared with the design mode in which all of the oxide thin-film transistors in the 18T1C shift-register unit select a multiple of W=5 μm).

Figure 5:
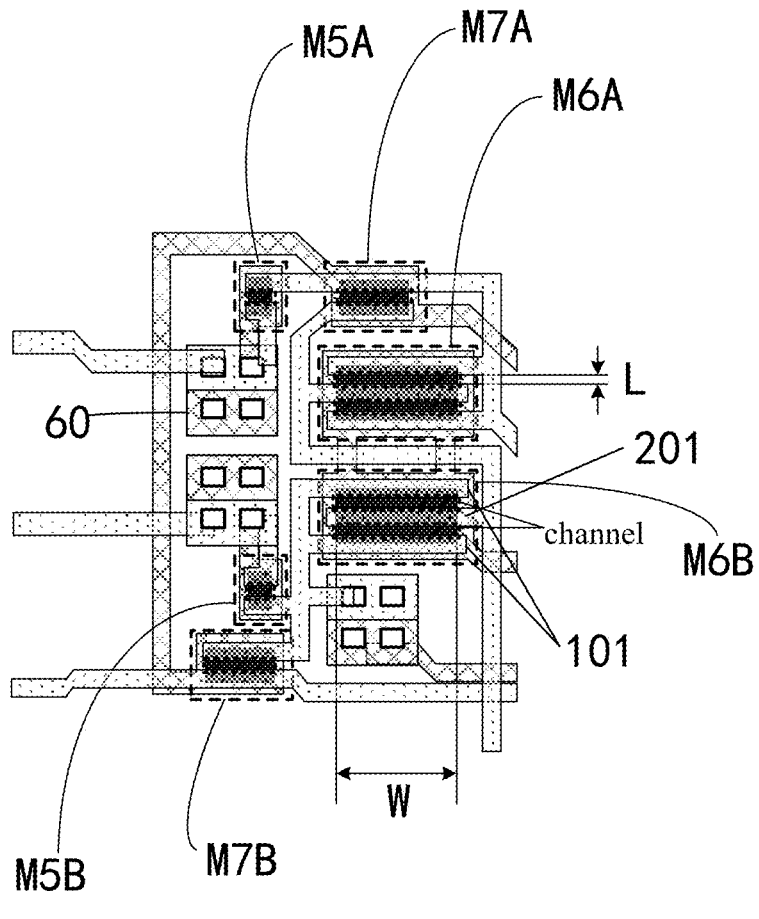
FIG. 5 shows a top view of the film layers of another shift-register unit according to an embodiment of the present disclosure.

In another alternative embodiment, as shown in FIG. 5, except the oxide thin-film transistor M6, all of the layout modes of the oxide-semiconductor regions of the other oxide thin-film transistors are the same as the embodiment shown in FIG. 1.

Referring to FIG. 5, the total channel width $W_{total}$ required by M6 is =50 μm, the oxide-semiconductor layer of M6 may be formed by one semiconductor branch whose W is =25 μm, and the semiconductor branch has two channels. The total channel width $W_{total}$ required by the oxide thin-film transistor M5 is =5 μm, the oxide-semiconductor layer of M5 may be formed by one semiconductor branch whose W is =5 μm, and the semiconductor branch has one channel. The design value of the $W_{total}$ ratio of M5 to M6 is =5:50=1:10. If the process fluctuation deviation is 1 μm, the minimum of the $W_{total}$ of M5 is 4 μm, and the minimum of the $W_{total}$ of M6 is (25−1)*2=48, and then the $W_{total}$ ratio of M5 to M6 is =4/48=1:12. The maximum of the $W_{total}$ of M5 is 6 μm, and the maximum of the $W_{total}$ of M6 is (25+1) *2=52, and then the $W_{total}$ ratio of M5 to M6 is =6/52=1:8.6.

In the embodiment shown in FIG. 5, the $W_{total}$ ratio of M5 to M6 fluctuates in the range of 1:8.6-1:12, which can enable the voltage of the pull-up node PU to maintain free of abnormality.

In some alternative embodiments, the width W of each of the semiconductor branches in the first direction D1 is greater than or equal to 5 μm, and less than or equal to 50 μm. According to the related test result including Table 2, when 5 μm≤W≤50 μm, all of the different oxide-semiconductor-layer patterns can ensure the Stress characteristics of the oxide thin-film transistors. Therefore, in practical applications, suitable semiconductor-branch widths W may be selected in the range of [5 μm, 50 μm], according to the total channel widths $W_{total}$ required by the oxide thin-film transistors, to fabricate the oxide-semiconductor-layer patterns.

Further optionally, the widths W in the first direction D1 of the semiconductor branches of each of the oxide thin-film transistors M may be equal. In other words, the semiconductor in the oxide thin-film transistor may be equally delimited into the semiconductor branches of an equal w. That can enable the fabricating process of the semiconductor branches to be simpler.

In addition, the grids of the oxide thin-film transistors in the shift-register unit may further have the following embodiments.

In some alternative embodiments, the grid of the oxide thin-film transistor extends in the extension direction of the corresponding semiconductor branch and overlaps with the semiconductor branch.

In some alternative embodiments, the grid of the at least some of the oxide thin-film transistors comprises one or more grid branches, each of the grid branches corresponds to at least one of the semiconductor branches, and one of the grid branches extends in the extension direction of one corresponding semiconductor branch and overlaps with the semiconductor branch; and the grid branches of the same oxide thin-film transistor are electrically connected to each other.

In some alternative embodiments, in the grid branches and the semiconductor branches of the same oxide thin-film transistor, the sum of the widths of the grid branches is slightly greater than the sum of the widths of the semiconductor branches.

Figure 6:
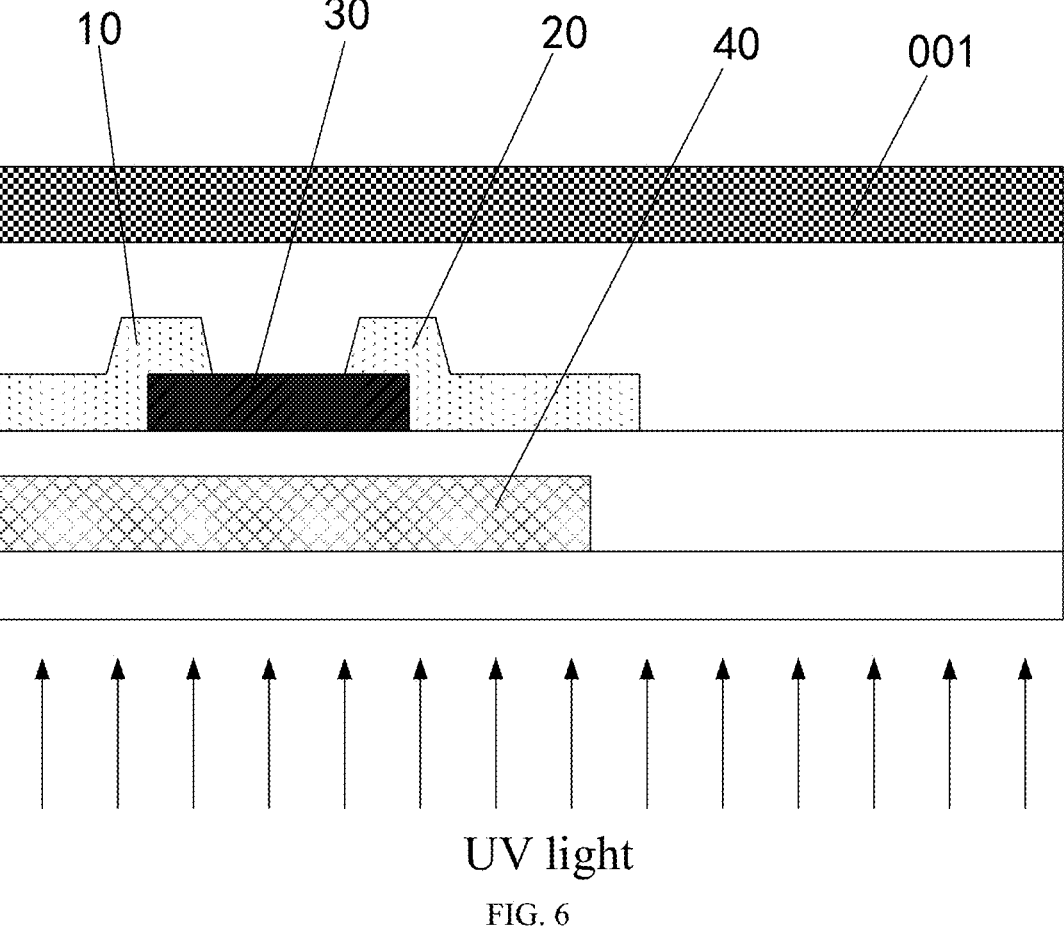
FIG. 6 shows a partially sectional view of a displaying device according to an embodiment of the present disclosure.

In particular applications, referring to the partially sectional view of the displaying device shown in FIG. 6, a pixel circuit 2000 may be provided in the displaying region AA of the display panel, the shift-register unit 1000 may be provided in the non-displaying region VA of the display panel, and the adhesive-frame region of the non-displaying region VA, in packaging, is provided with a packaging-adhesive layer (seal adhesive) 001. The packaging-adhesive layer 001 is required to be solidified by UV (ultraviolet) light, and the UV light is required to enter on the side of the oxide-semiconductor layer that is away from the grid to realize the solidification. However, in some solutions of semiconductors, for example, a solution in which the oxide-semiconductor layer is an oxide-semiconductor layer of an integral structure, and the solution shown in FIG. 5 in which the oxide-semiconductor layer has a pattern of discrete semiconductor branches but the width W of each of the semiconductor branches is =5 μm and the semiconductor branches have a spacing of 7 μm therebetween, during the UV solidification of the packaging-adhesive layer 001, the grid formed by an whole block of metal has a high size, which results in an insufficient transmittance of the UV light, whereby the packaging-adhesive layer 001 is solidified insufficiently, which easily causes the problems such as liquid-crystal pollution around the displaying region and the disengaging of the packaging-adhesive layer in the high-temperature high-pressure high-humidity environment. Additionally, the excessively high grid width increases the area of the intersection or overlapping between the grid metal and the source-drain metal, and the parasitic capacitance of the thin-film transistor correspondingly increases, which results in increasing of the power consumption.

If the UV-light transmittance of the adhesive-frame region is intended to satisfy the requirement of the solidification, then it is required to control the width of the grid. The inventor has found by experimentation that, when a certain equal $W_{total}$ is used, if an oxide-semiconductor-layer pattern whose W is =5 μm is used, then the grid width is 73 μm, which cannot satisfy the demand of the UV-light transmittance, while if an oxide-semiconductor-region pattern whose W is =10 μm is used, then the grid width is merely 50 μm, which can satisfy the demand of the UV-light transmittance. Therefore, by the customized design of the oxide-semiconductor-layer pattern, the demands on the heat dissipation, the reduction of the border frame and the solidification of the packaging adhesive in the adhesive-frame region can be satisfied at the same time.

Figure 7:
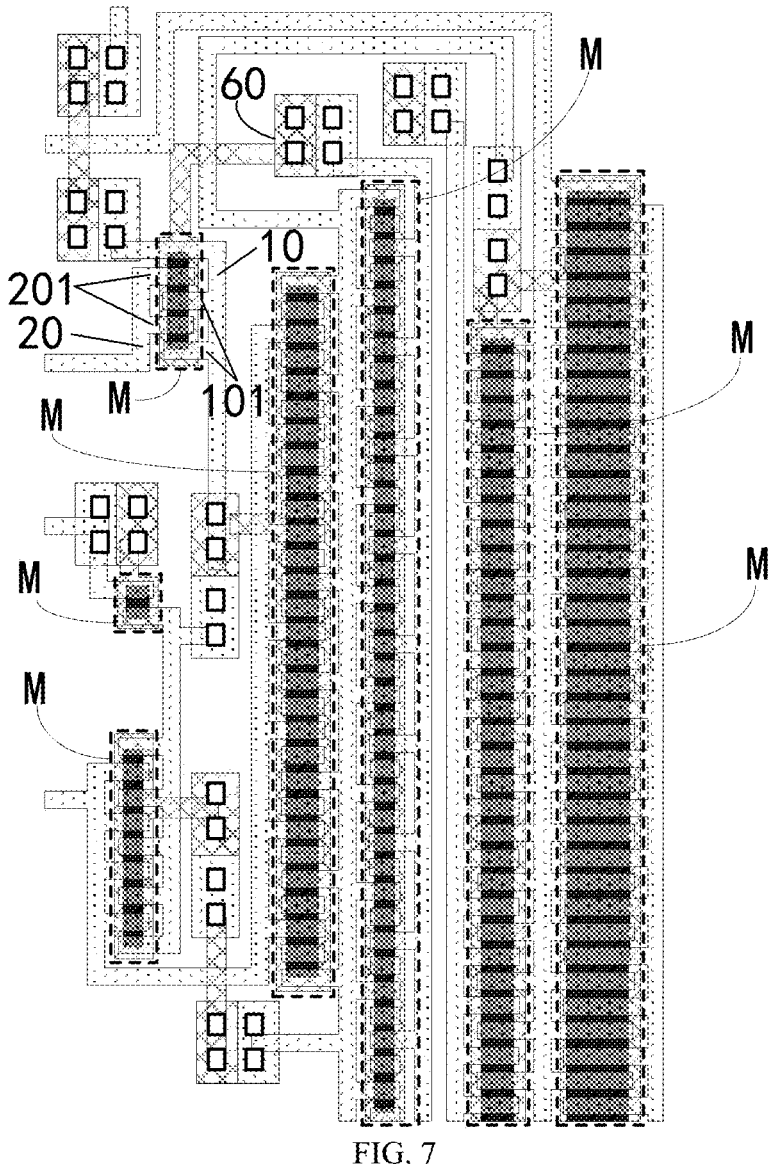
FIG. 7 shows a top view of the film layers of yet another shift-register unit according to an embodiment of the present disclosure.

In addition, further optionally, in some embodiments, referring to FIG. 7, each of the oxide thin-film transistors in the shift-register unit may comprise merely one semiconductor branch, and in the one independent semiconductor branch, the channels may be arranged into one row in the direction of the arrangement of the shift-register units. In a multiplexing architecture of the grid driving circuit, one shift-register unit can be used to drive at least two rows of the pixel circuits. Therefore, in a multiplexing architecture of the grid driving circuit, a low quantity of the shift-register units are required. Therefore, each of the shift-register units has more room available to be occupied in the direction of the arrangement of the cascaded shift-register units. In this case, the channels of the one semiconductor branch comprised by each of the oxide thin-film transistors can be arranged into one row in the direction of the arrangement of the shift-register units, which can reduce the room occupied by the shift-register units in the direction from the non-displaying region to the displaying region (i.e., the first direction D1), and thus can further reduce the size of the border frame of the displaying device.

Figure 8:
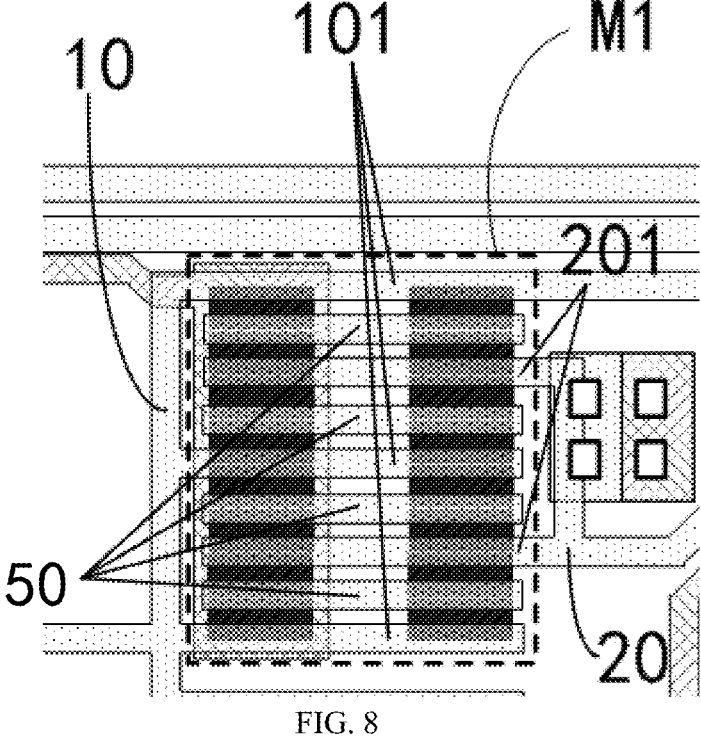
FIG. 8 shows a schematic diagram of a dummy electrode according to an embodiment of the present disclosure.

Additionally, further optionally, in some embodiments, referring to FIG. 8, the shift-register unit may further comprise one or more dummy electrodes 50; and the dummy electrodes 50 are located between at least some of the neighboring source branches 101 and drain branches 102 of at least some of the oxide thin-film transistors M, the dummy electrodes 50, the source branches 101 and the drain branches 201 are formed by patterning of the same one film layer, and the dummy electrodes 50 are not electrically connected to any electrically conductive pattern.

The dummy electrodes 50 are not electrified, but can provide a good support to the oxide-semiconductor layers, and also can increase the flatness of the non-displaying region of the display panel.

It should be noted that FIGS. 1, 5 and 7 merely illustratively show some shift-register units, and illustratively show some arrangement modes of the oxide-semiconductor layers of the shift-register units, and the present disclosure is not intended to limit the particular shift-register units and arrangement modes of the oxide-semiconductor layers. Furthermore, the figures of the present disclosure merely illustratively show some of the film layers and some of the connection relations between the film layers, which do not limit the present disclosure.

Certainly, in practical applications, the shift-register unit according to the embodiments of the present disclosure may also be of the 22T1C architecture, in which, based on the 18T1C of FIG. 1, 4 oxide thin-film transistors M are added. All of the 4 added oxide thin-film transistors M can be used to increase the voltage of the pull-up node PU. In the 22T1C architecture, the $W_{total}$ ratio of M5 to M6 has little influence on the retention rate of the pull-up node PU. Therefore, in the 22T1C architecture, the $W_{total}$ ratio of M5 to M6 is not required to be limited not less than 1:8, and is not particularly limited in the embodiments of the present disclosure.

The above-described 18T1C architecture merely illustratively describes an architecture of the shift-register unit that is influenced by the $W_{total}$ ratio of M5 to M6, and the above-described 22T1C architecture merely illustratively describes an architecture of the shift-register unit that is not influenced by the $W_{total}$ ratio of M5 to M6. It can be understood that the oxide thin-film transistors according to the present disclosure are not merely suitable for the above-described 18T1C shift-register unit and 22T1C shift-register unit, the oxide thin-film transistors whose $W_{total}$ ratio influences the shift-register unit are not limited to the above-described M5 and M6, and the present disclosure is not intended to limit them.

It can be understood that, regarding the shift-register units that are not influenced by the $W_{total}$ ratio of any two or more oxide thin-film transistors, the $W_{total}$ ratios of those oxide thin-film transistors are not required to be configured with the special ratios, while regarding the shift-register units that are influenced by the $W_{total}$ ratio of any two or more oxide thin-film transistors, the $W_{total}$ ratios of those oxide thin-film transistors are required to be configured with the special ratios. The particular ratios may be verified by experimentation with the motivation by the embodiments of the present disclosure.

In the embodiments of the present disclosure, the oxide thin-film transistors with the demand on unequal total channel widths in the shift-register unit may employ semiconductor-branch patterns of unequal widths according to the grid size that satisfies the demand on the solidification of the packaging-adhesive layer and the demand on the reduction of the border frame, which shrinks the border frame, reduces the parasitic capacitance of the oxide thin-film transistors to save the power consumption, and solves the problem of insufficient solidification of the packaging-adhesive layer caused by a high width of the grid metal.

It should also be noted that, in the present disclosure, the source and the drain are merely described relatively, and in the particular process of the implementation of the present disclosure, the source and the drain may be exchanged according to particular thin-film transistors.

An embodiment of the present disclosure further discloses a grid driving circuit, wherein the grid driving circuit comprises a plurality of shift-register units that are cascaded, and each of the shift-register units is the shift-register unit stated above.

An embodiment of the present disclosure further discloses a displaying device, wherein the displaying device comprises the grid driving circuit stated above.

In some embodiments, the displaying device may be of an architecture of double-side grid driving. In other words, in the displaying device, both of the two sides of the displaying region may be provided with a grid driving circuit, wherein the grid driving circuit on one side may be used to drive some of the pixel circuits (for example, the pixel circuits in the odd-number rows), and the grid driving circuit on the other side may be used to drive the remaining pixel circuits (for example, the pixel circuits in the even-number rows), which is not particularly limited in the embodiments of the present disclosure.

In the embodiments of the present disclosure, the oxide-semiconductor layers of the oxide thin-film transistors may be delimited into regions according to the total channel widths and the channel lengths required by the oxide thin-film transistors in the shift-register unit, wherein the sum of the widths of the independent semiconductor branches obtained by the delimitation is equal to the required total channel width. Accordingly, one oxide thin-film transistor can realize the required total channel width by using the one or more semiconductor branches, to ensure the normal operation of the oxide thin-film transistor, whereby the oxide-semiconductor layers of the different oxide thin-film transistors can be configured differently, to realize the purpose of reducing the border frame of the displaying device.

Moreover, the semiconductor branches of a lower size and the gaps between the semiconductor branches can be used for heat dissipation, thereby preventing failure of the oxide thin-film transistors caused by heat accumulation of the oxide semiconductor.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A shift-register unit, located on a substrate of a display panel, located in a non-displaying region, comprising a plurality of oxide thin-film transistors, each of the plurality of oxide thin-film transistors comprising an oxide-semiconductor layer and a source and a drain that are connected to the oxide-semiconductor layer and are separately provided, wherein each of the source and the drain of at least some of the oxide thin-film transistors has a plurality of branches;

the source comprises a plurality of source branches extending in a first direction, and the drain comprises a plurality of drain branches extending in the first direction;

the plurality of source branches and the plurality of drain branches face each other and sequentially intersect in a second direction;

the oxide-semiconductor layer has at least one semiconductor branch or a plurality of semiconductor branches that are separately and parallelly distributed, each of the semiconductor branches extends in the second direction perpendicular to an extension direction of the drain and overlaps with and is electrically connected to the source branches and the drain branches, and a width of the semiconductor branch that overlaps with any neighboring source branch and drain branch is a distance W of the semiconductor branch from one end to the other end in the first direction;

wherein the shift-register unit comprises a pull-down controlling circuit, and the pull-down controlling circuit comprises: a first oxide thin-film transistor located between a pull-down node and a high-level reference-voltage terminal, and a second oxide thin-film transistor located between the pull-down node and a low-level reference-voltage terminal;

each of the oxide thin-film transistors satisfies the following formula: $W_{total} = D_{total\ channel\ quantity} * W$;

where W is a width of each of the semiconductor branches, $D_{total\ channel\ quantity}$ is a sum of quantities of channels of the semiconductor branches between the source branches and the neighboring drain branches in each of the oxide thin-film transistors, and $W_{total}$ is a total width of the channels; and a ratio of $W_{total}$ of the first oxide thin-film transistor to $W_{total}$ of the second oxide thin-film transistor is between 1:8.6~1:12;

wherein the width W of each of the semiconductor branches of the at least some of the oxide thin-film transistors is not less than 3 μm, and not greater than 60 μm.

2. The shift-register unit according to claim 1, wherein the ratio of $W_{total}$ of the first oxide thin-film transistor to $W_{total}$ of the second oxide thin-film transistor is between 1:10~1:12.

3. The shift-register unit according to claim 1, wherein the at least some of the oxide thin-film transistors are the plurality of oxide thin-film transistors, and the widths of the semiconductor branches of different oxide thin-film transistors are not completely equal.

4. The shift-register unit according to claim 1, wherein the $W_{total}$ of the first oxide thin-film transistor is not less than 5 μm, and the $W_{total}$ of the second oxide thin-film transistor is not greater than 50 μm.

5. The shift-register unit according to claim 1, wherein the pull-down controlling circuit has one or two instances of the pull-down node, a quantity of the first oxide thin-film transistor is one or two oxide thin-film transistors that are correspondingly connected to the pull-down nodes one to one, and a quantity of the second oxide thin-film transistor is one or two oxide thin-film transistors that are correspondingly connected to the pull-down nodes one to one;

in the two first oxide thin-film transistors, channel lengths are equal, the widths of the semiconductor branches are equal, the quantities of the semiconductor branches are equal, and spacings between the neighboring semiconductor branches are equal; and in the two second oxide thin-film transistors, channel lengths are equal, the widths of the semiconductor branches are equal, the quantities of the semiconductor branches are equal, and spacings between the neighboring semiconductor branches are equal.

6. The shift-register unit according to claim 1, wherein a quantity of the semiconductor branches of each of the first oxide thin-film transistors is one, quantities of the source branches and the drain branches are one individually, the width of each of the semiconductor branches is 3-6 μm, and the width of the semiconductor branches is a total width of the channels of the first oxide thin-film transistor.

7. The shift-register unit according to claim 6, wherein at least the first oxide thin-film transistor, the second oxide thin-film transistor and the third oxide thin-film transistor of the shift-register unit are located in an adhesive-frame region of the substrate of the display panel;

the source branches and the drain branches of the first oxide thin-film transistor, the second oxide thin-film transistor and the third oxide thin-film transistor extend in a direction perpendicular to an edge of the substrate;

the first oxide thin-film transistor and the second oxide thin-film transistor are arranged sequentially in the direction perpendicular to the edge of the substrate;

the first oxide thin-film transistor and the third oxide thin-film transistor are individually one, and are located on a same side of the second oxide thin-film transistor; or the first oxide thin-film transistor and the third oxide thin-film transistor are individually two, one pair of the first oxide thin-film transistor and the third oxide thin-film transistor are located on one side of the second oxide thin-film transistor, and the other pair of the first oxide thin-film transistor and the third oxide thin-film transistor are located on the other side of the second oxide thin-film transistor;

the one pair of the first oxide thin-film transistor and the third oxide thin-film transistor located on the one side of the second oxide thin-film transistor are arranged sequentially in the direction perpendicular to the edge of the substrate, and the other pair of the first oxide thin-film transistor and the third oxide thin-film transistor located on the other side of the second oxide thin-film transistor are arranged sequentially in a direction of the edge of the substrate; and the two pairs of the first oxide thin-film transistor and the third oxide thin-film transistor are arranged sequentially in the direction of the edge of the substrate.

8. The shift-register unit according to claim 1, wherein the $W_{total}$ of the second oxide thin-film transistor is between 37~43 μm;

a quantity of the semiconductor branches of the second oxide thin-film transistor is four, a quantity of the source branches is two, a quantity of the drain branches is one, the $D_{total\ channel\ quantity}$ is eight, the width of each of the semiconductor branches is $(\frac{1}{8}) * W_{total}$, and a spacing between the semiconductor branches is between 6~10 μm; and the one of the semiconductor branches extends from one of the source branches via the drain branch to another of the source branches, and contacts the source branches and the drain branch; or the $W_{total}$ of the second oxide thin-film transistor is between 48~52 μm;

a quantity of the semiconductor branches of the second oxide thin-film transistor is one, a quantity of the source branches is two, a quantity of the drain branches is one, and the one of the semiconductor branches extends from one of the source branches via the drain branch to another of the source branches and contacts the source branches and the drain branch; and the width of the semiconductor branch is a half of the $W_{total}$ of the second oxide thin-film transistor, the $D_{total\ channel\ quantity}$ is two, and the width of the semiconductor branch is between 24~26 μm.

9. The shift-register unit according to claim 1, wherein the shift-register unit comprises a third oxide thin-film transistor located between the pull-down node and the low-level reference-voltage terminal, a grid of the third oxide thin-film transistor is connected to an inputting terminal of the shift-register unit, and a source and a drain of the third oxide thin-film transistor are connected to the pull-down node and the low-level reference-voltage terminal respectively;

a quantity of the third oxide thin-film transistor is one or two; and each of the third oxide thin-film transistors comprises one source branch, one drain branch and one semiconductor branch, and a width W of the semiconductor branch is between 18~22 μm.

10. The shift-register unit according to claim 1, wherein the shift-register unit comprises a fourth oxide thin-film transistor, a source and a drain of the fourth oxide thin-film transistor are connected to a pull-up node and the low-level reference-voltage terminal respectively, and a grid is connected to the pull-down node;

a quantity of the fourth oxide thin-film transistor is one or two;

a quantity of semiconductor branches of the fourth oxide thin-film transistor is one or two, quantities of the source branches and the drain branches are two individually, and the $D_{total\ channel\ quantity}$ is three or six; and when a quantity of the semiconductor branches is two, a width of each of the semiconductor branches is between 20~25 μm, and a spacing between the semiconductor branches is between 10~14 μm; or when a quantity of the semiconductor branches is one, a width of the semiconductor branch is between 40~50 μm.

11. The shift-register unit according to claim 1, wherein the shift-register unit comprises a fifth oxide thin-film transistor, a source and a drain of the fifth oxide thin-film transistor are connected to a first outputting terminal of the shift-register unit and the low-level reference-voltage terminal respectively, and a grid is connected to the pull-down node;

a quantity of the fifth oxide thin-film transistor is one or two; and each of the fifth oxide thin-film transistors comprises one source branch, one drain branch and one semiconductor branch, and a width W of the semiconductor branch is between 8~12 μm.

12. The shift-register unit according to claim 1, wherein the shift-register unit comprises a sixth oxide thin-film transistor, a source and a grid of the sixth oxide thin-film transistor are connected to an inputting terminal of the shift-register unit, and a drain is connected to a pull-up node;

a quantity of the sixth oxide thin-film transistor is one, the sixth oxide thin-film transistor comprises three source branches and two drain branches, and the $D_{total\ channel\ quantity}$ is four or eight; and when a quantity of the semiconductor branches is two, a width W of each of the semiconductor branches is between 15~20 μm, and a spacing between the semiconductor branches is between 10~14 μm; or when a quantity of the semiconductor branches is one, a width W of the semiconductor branch is between 30~40 μm.

13. The shift-register unit according to claim 1, wherein the shift-register unit comprises a seventh oxide thin-film transistor, a source and a drain of the seventh oxide thin-film transistor are connected to the pull-up node of the shift-register unit and the low-level reference-voltage terminal respectively, and a grid is connected to a frame resetting terminal of the shift-register unit; and a quantity of the seventh oxide thin-film transistor is one, the seventh oxide thin-film transistor comprises one source branch, one drain branch and one semiconductor branch, and a width W of the semiconductor branch is between 8~12 μm.

14. The shift-register unit according to claim 1, wherein the shift-register unit comprises an eighth oxide thin-film transistor, a source and a drain of the eighth oxide thin-film transistor are connected to the pull-up node of the shift-register unit and the low-level reference-voltage terminal respectively, and a grid is connected to a first resetting terminal of the shift-register unit; and a quantity of the eighth oxide thin-film transistor is one, the eighth oxide thin-film transistor comprises one source branch, one drain branch and one semiconductor branch, and a width W of the semiconductor branch is between 22~28 μm.

15. The shift-register unit according to claim 1, wherein the shift-register unit comprises a ninth oxide thin-film transistor, a source and a drain of the ninth oxide thin-film transistor are connected to a second outputting terminal of the shift-register unit and the low-level reference-voltage terminal respectively, and a grid is connected to the pull-down node;

a quantity of the ninth oxide thin-film transistor is one or two;

a quantity of the semiconductor branches of each of the ninth oxide thin-film transistors is one or two, quantities of the source branches and the drain branches are one individually, and the $D_{total\ channel\ quantity}$ is one or two; and when a quantity of the semiconductor branches is two, a width W of each of the semiconductor branches is between 18~22 μm, and a spacing between the semiconductor branches is between 6~10 μm; or when a quantity of the semiconductor branches is one, a width W of the semiconductor branch is between 36~44 μm.

16. The shift-register unit according to claim 1, wherein the shift-register unit comprises a tenth oxide thin-film transistor, a source and a drain of the tenth oxide thin-film transistor are connected to a clock-signal terminal and a first outputting terminal of the shift-register unit respectively, and a grid is connected to a pull-up node;

a quantity of the tenth oxide thin-film transistor is one or two;

each of the tenth oxide thin-film transistors comprises six source branches, five drain branches and one or two semiconductor branches, and the $D_{total\ channel\ quantity}$ is ten or twenty; and when a quantity of the semiconductor branches is two, a width W of each of the semiconductor branches is between 18~22 μm, and a spacing between the semiconductor branches is between 10~14 μm; or when a quantity of the semiconductor branches is one, a width W of the semiconductor branch is between 36~44 μm.

17. The shift-register unit according to claim 1, wherein the shift-register unit comprises an eleventh oxide thin-film transistor, a source and a drain of the eleventh oxide thin-film transistor are connected to the clock-signal terminal and a second outputting terminal of the shift-register unit respectively, and a grid is connected to the pull-up node;

a quantity of the eleventh oxide thin-film transistor is one, the eleventh oxide thin-film transistor comprises seven source branches, seven drain branches and sixteen semiconductor branches, the $D_{total\ channel\ quantity}$ is one hundred and twenty-one, a width W of each of the semiconductor branches is between 3-6 μm, and a spacing between the semiconductor branches is between 6-10 μm;

a length in an extension direction of the semiconductor branches of eight of the semiconductor branches of the eleventh oxide thin-film transistor that are away from a displaying region of the display panel is greater than a length in the extension direction of the semiconductor branches of eight of the semiconductor branches of the eleventh oxide thin-film transistor that are close to the displaying region of the display panel; and among the eight of the semiconductor branches of the eleventh oxide thin-film transistor that are away from the displaying region of the display panel, all of quantities of channels of each of the semiconductor branches are 13, and among the eight of the semiconductor branches of the eleventh oxide thin-film transistor that are close to the displaying region of the display panel, all of quantities of channels of each of the semiconductor branches are 12.

18. The shift-register unit according to claim 1, wherein the shift-register unit comprises a twelfth oxide thin-film transistor, a source and a drain of the twelfth oxide thin-film transistor are connected to the second outputting terminal and the low-level reference-voltage terminal of the shift-register unit respectively, and a grid is connected to a second resetting terminal of the shift-register unit; and a quantity of the twelfth oxide thin-film transistor is one, the twelfth oxide thin-film transistor comprises one source branch, one drain branch and one semiconductor branch, and a width W of the semiconductor branch is between 18~22 μm.

19. A grid driving circuit, wherein the grid driving circuit comprises a plurality of shift-register units that are cascaded, and each of the shift-register units is the shift-register unit according to claim 1.

* * * * *